United States Patent [19]
Campbell

[11] 3,808,466
[45] Apr. 30, 1974

[54] CAPACITIVE-DISCHARGE TIMING CIRCUIT USING COMPARATOR TRANSISTOR BASE CURRENT TO DETERMINE DISCHARGE RATE

[75] Inventor: Leonard Richard Campbell, Piscataway, N.J.

[73] Assignee: RCA Corporation, New York, N.Y.

[22] Filed: June 5, 1972

[21] Appl. No.: 259,711

[52] U.S. Cl. .................. 307/293, 307/235, 307/246, 330/30 D
[51] Int. Cl. .................. H03k 17/26
[58] Field of Search .................. 307/235, 293, 246; 330/30 D; 328/146–149

[56] References Cited

UNITED STATES PATENTS 3,474,259 10/1969 Rodgers .................. 307/235 X
3,484,624 12/1969 Rasiel et al. .................. 307/235 X
3,688,131 8/1972 Hirsch .................. 307/293

OTHER PUBLICATIONS

"Timing Circuit" by Chapman et al., IBM Tech. Disclosure Bulletin, Vol. 12, No. 6, Nov. 1969, pages 755–756.
"Low-Cost, Long-Delay Timer" by Schaefer et al., EDN/EEE, Vol. 16, No. 11, June 1, 1971.

*Primary Examiner*—Stanley D. Miller, Jr.

[57] ABSTRACT

A timing capacitor is connected to one of the input terminals of a differential, transistor amplifier which forms part of an operational amplifier. The capacitor is controllably discharged through the base-to-emitter path of one of the differential transistors. An output signal of programmable duration is thereby derived from the operational amplifier according to the discharge duration of the capacitor.

10 Claims, 6 Drawing Figures

CAPACITIVE-DISCHARGE TIMING CIRCUIT USING COMPARATOR TRANSISTOR BASE CURRENT TO DETERMINE DISCHARGE RATE

This invention relates generally to electronic timing circuits and, particularly, to electronic timing circuits capable of providing an output of long duration.

Many applications arise where it is desirable to provide a timing circuit capable of providing an output signal of long duration. In some instances it may even be desirable to provide a timing circuit which can be programmed to provide an output signal for a predetermined duration. For example, in the case of appliances such as electronically controlled ovens it may be desirable to provide a circuit which can be used to time the operation of the appliance for a predetermined period of time. In the prior art this was normally accomplished by using a relaxation oscillator having an oscillation period determined by an RC time constant. To provide an output of long duration generally required the use of resistors and capacitors of large magnitude which proved to be bulky in size and sensitive to temperature variations. Moreover, such circuits do not lend themselves to miniaturization in accordance with modern circuit design techniques.

An electronic timing circuit, in accordance with the present invention, utilizes a programmable operational amplifier to multiply the time constant of an RC circuit and thereby provide an output of long duration.

The present invention will be more fully understood by reference to the following detailed description in conjunction with the accompanying drawing wherein.

Figure 3A:
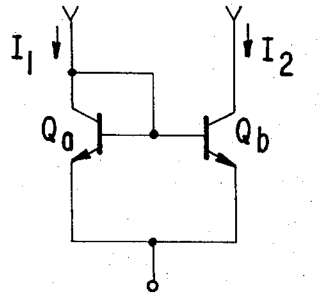
Figure 3B:
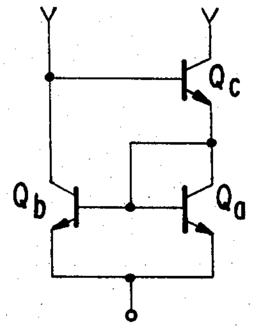
Figure 4:
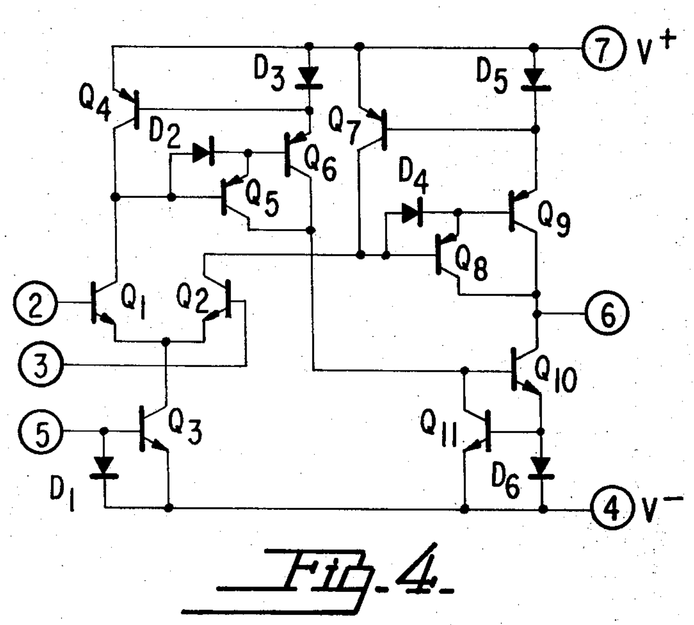

FIGS. 3*a* and 3*b* are illustrative of current mirror circuits as used in the RCA-CA3080;

FIG. 4 is a schematic diagram of the RCA-CA3080; and

Figure 5:
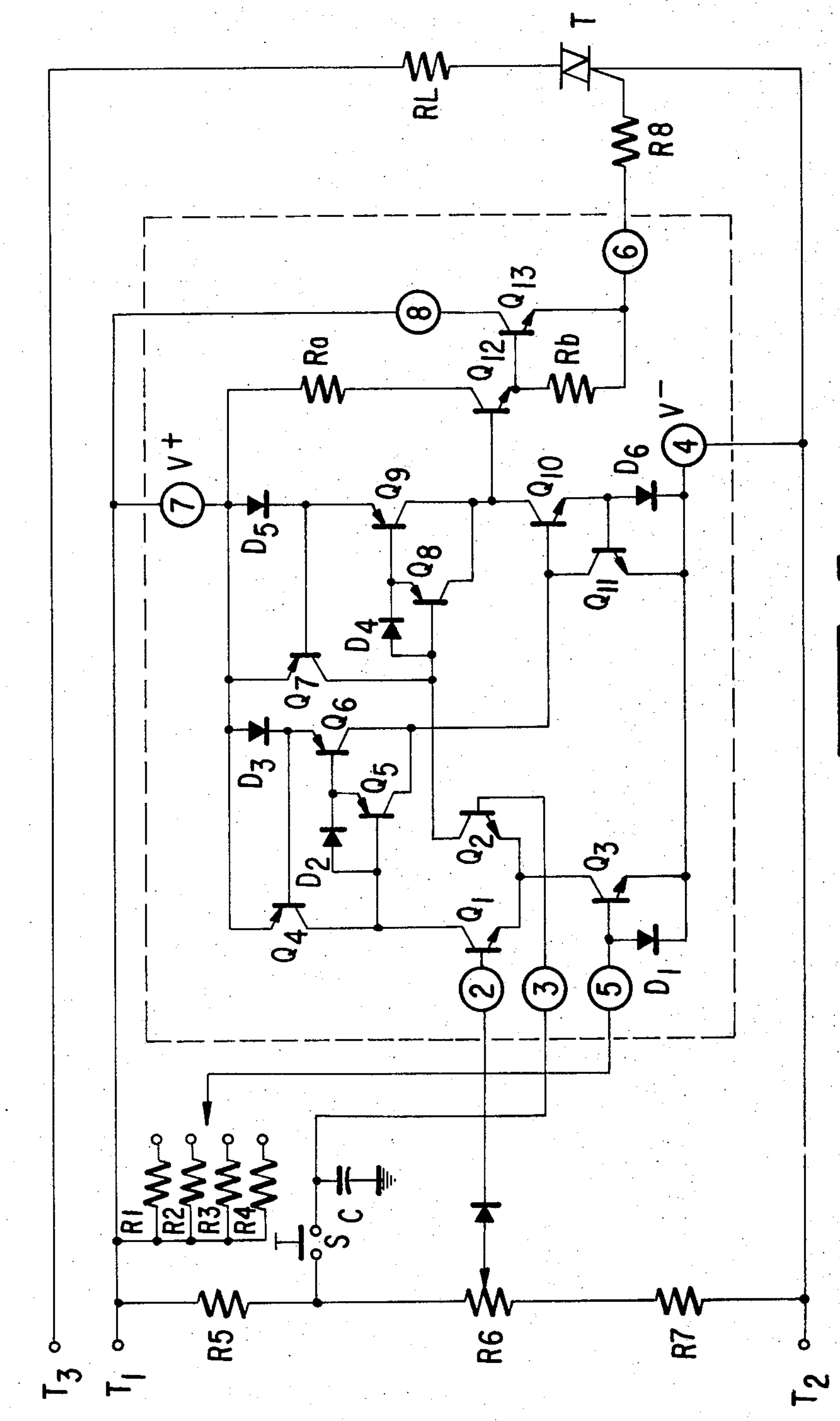

FIG. 5 is illustrative of a switching circuit embodying an electronic timer in accordance with the present invention which utilizes an RCA-CA3094 integrated circuit operational amplifier.

The RCA-CA3080 is a member of a new class of operational amplifiers which, in addition to the usual differential terminals, contains an additional control terminal which enhances the device's flexibility for use in a broad spectrum of applications. These amplifiers are referred to as operational transductance amplifiers (OTA) because their output signals are best described in terms of the output current which they are capable of supplying; i.e., transconductance $g_m = (\Delta i_{out}/\Delta e_{in})$. In the case of OTA's, the output current is proportional to the voltage difference at the differential input terminals. For a more detailed analysis of operational transconductance amplifiers see "RCA Linear Integrated Circuits," Technical Series IC-42, pgs. 179–195, published in 1970.

Figure 2:
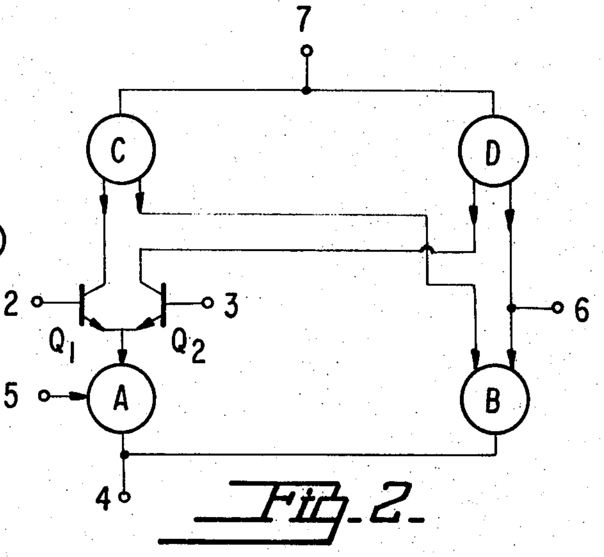
FIG. 2 is a functional block diagram of the RCA-CA3080.

Turning first to a description of the simplified diagram of the CA-3080 as illustrated in FIG. 2, it will be seen that the chip comprises a pair of transistors $Q_1$ and $Q_2$ connected in differential configuration and a series of current mirrors designated A, B, C and D.

FIGS. 3*a* and 3*b* are illustrative of conventional current mirrors as used in the CA-3080. FIG. 3*a* shows a basic current mirror configuration which is comprised of two transistors $Q_a$ and $Q_b$, one of which is "diode-connected," i.e. $Q_a$. Assuming that both transistors have identical characteristics, a prerequisite established by IC fabrication techniques, the current $I_2$ flowing through $Q_b$ is controlled by and equal to the current $I_1$ flowing through the diode-connected transistor $Q_a$. The addition of another active transistor $Q_c$, as shown in FIG. 3*b*, greatly diminishes the sensitivity of the current to transistor beta ($\beta$) and increases the current source output impedance in direct proportion thereto. With respect to the functional block diagram of the CA-3080 shown in FIG. 2, current mirror A uses the configuration shown in FIG. 3*a* while mirrors B, C and D are basically the version shown in FIG. 3*b*.

Turning now to a description of the CA-3080 as shown in FIG. 4, it will be seen that the OTA formed on the chip employs only active devices, i.e. transistors and diodes. For purposes of simplification the diode-connected transistors of FIGS. 4 and 5 are shown as conventional diodes.

Current mirror A of FIg. 2 is represented in FIG. 4 by transistor $Q_3$ and diode $D_1$, i.e. a conventional current mirror as discussed with reference to FIG. 3*a*. Current applied to the amplifier bias-current terminal 5 of the CA-3080 from an external source (not shown) establishes the emitter current of the input differential amplifier $Q_1$ and $Q_2$. In this manner effective control of the differential transconductance ($g_m$) is achieved. For a further explanation of OTA operation see RCA Application Note ICAN-6668 entitled "Applications of the CA-3080 and CA-3080A, High Performance Operational Transconductance Amplifiers" by H.A. Wittlinger, and U. S. Pat. No. 3,416,645.

Transistors $Q_4$, $Q_5$, $Q_6$ and diodes $D_2$ and $D_3$ shown in FIG. 2 as current mirror C, comprise the load circuit for transistor $Q_1$. It will be seen that the configuration of current mirror C shown in FIG. 4 is basically simlar to the configuration shown in FIG. 3*b* except for the use of Darlington connected transistors, which are employed to increase the output impedance of the mirror and reduce its sensitivity, and the connection of diode $D_2$ across the base-emitter junction of $Q_5$ for the purpose of improving circuit speed. Transistors $Q_7$, $Q_8$, $Q_9$ and diodes $D_4$ and $D_5$, which are connected in similar fashion to form current mirror D, comprise the load circuit for transistor $Q_2$. Transistors $Q_4$, $Q_5$, $Q_6$, $Q_7$, $Q_8$ and $Q_9$ are of opposite conductivity type relative to transistors $Q_1$ and $Q_2$. The collectors of transistors $Q_6$ and $Q_9$ are connected to the base and collector electrodes, respectively, of transistor $Q_{10}$, which, together with transistor $Q_{11}$ and diode $D_6$ forms current mirror B.

With respect to pin connections, terminals 2 and 3 of the CA-3080 represent the inverting input and non-inverting input to transistors $Q_1$ and $Q_2$, respectively; terminals 7 and 4 are adapted for connection to the positive and negative terminals, respectively, of a DC supply (not shown); terminal 5 is adapted for connection to an external source of current intended to serve as the amplifier bias current; and terminal 6 is the output terminal.

Assuming a fixed bias current at terminal 5, the current flowing through transistor $Q_3$ will divide between transistors $Q_1$ and $Q_2$ depending upon the difference in signal input voltages applied to the base electrodes of $Q_1$ and $Q_2$ via input terminals 2 and 3, respectively. If the voltages applied to input terminals 2 and 3 are equal, the current supplied to transistor $Q_3$ will divide equally between transistors $Q_1$ and $Q_2$. The current requirements of transistors $Q_1$ and $Q_2$, in turn, will be substantially provided by the collector currents of transistors $Q_4$ and $Q_7$, respectively. With transistors $Q_4$ and $Q_7$ drawing equal current, the equal collector currents of transistors $Q_6$ and $Q_9$ established due to the mechansim of current mirror operation effectively flow through transistors $Q_{11}$ and $Q_{10}$, and no current flows through the output terminal 6.

If the signal input voltage applied to the base of transistor $Q_2$ via non-inverting terminal 3 is increased relative to the signal input voltage applied to the base of transistor $Q_1$ via terminal 2, the collector current of transistor $Q_2$ will increase by $\Delta i$. Since transistor $Q_3$ is a constant current source, the collector current of transistor $Q_1$ will correspondingly decrease by $\Delta i$. The collector current increase of transistor $Q_2$ will result in a corresponding increase in the collector currents of transistors $Q_7$ and $Q_9$. Similarly, the collector current decrease of transistor $Q_1$ will result in a corresponding decrease in the collector currents of transistors $Q_4$ and $Q_6$. Consequently, it will be seen that the difference between the collector currents of transistors $Q_9$ and $Q_6$ is equal to $2\Delta i$ and, since the current drawn by current mirror $\beta$ is limited to the collector current output of transistor $Q_6$, an excess current of $2\Delta i$ will be available as an output current to terminal 6 via transistor $Q_9$. Conversely, if the signal input voltage applied to transistor $Q_1$ is increased relative to transistor $Q_2$, the collector current output of transistor $Q_9$ would be insufficient to satisfy the increased current requirements of transistor $Q_{10}$ (as established by transistor $Q_{11}$ via transistor $Q_6$) and the additional current (i.e. $2\Delta i$) would have to be provided from the output circuit via terminal 6. Accordingly, it will be seen that the CA-3080 can either ∓source" or "sink" current at the output terminals, depending on the polarity of the input signal.

Figure 1:
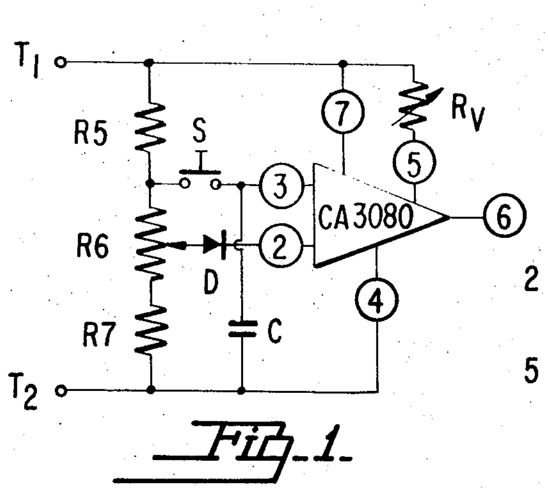
FIG. 1 is illustrative of an electronic timing circuit in accordance with the present invention which embodies an RCA-CA3080 integrated circuit operational amplifier.

Turning now to a description of FIG. 1, terminals 4 and 7 of the CA-3080 are connected to a pair of input terminals $T_1$, $T_2$ adapted for connection to a DC power supply of appropriate polarity. A voltage dividing network comprising resistor $R_5$, potentiometer $R_6$, and resistor $R_7$ is similarly connected between terminals $T_1$, $T_2$; resistor $R_5$ serving as a current limiting resistor and resistor $R_7$ to establish a minimum voltage above ground for reliable operation. A normally open switch S is connected between the non-inverting input terminal 3 of the CA-3080 and the junction formed between resistor $R_5$ and potentiometer $R_6$. The pick off terminal of potentiometer $R_6$ is connected to the inverting input terminal 2 of the CA-3080 through a diode D poled to conduct conventional current toward said input terminal. A capacitor C is connected between terminals 3 and 4 of the CA-3080. A variable resistance $R_v$ is connected between the amplifier bias current terminal 5 of the chip and terminal 7 thereof; the setting on $R_v$ determining the constant current drawn by current mirror A as shown in FIG. 2 and, consequently, the emitter current of the differential amplifier within the CA-3080. For purposes of discussion the potential across non-inverting terminal 3 and terminal 4 will be referred to as $E_1$, and the potential across inverting terminal 2 and terminal 4 as $E_2$.

Circuit operation is initiated by momentarily closing switch S thereby causing capacitor C to charge through resistor $R_5$ as a function of the potential provided by the DC power supply across terminals $T_1$ and $T_2$. Due to the voltage dividing action resulting from the setting of the potentiometer $R_6$, when switch S is released $E_1$ will be greater than $E_2$ and an output current will be provided from terminal 6 as discussed supra. As soon as switch S returns to its normally open position, capacitor C will begin to discharge through the non-inverting input terminal 3. The current discharge from capacitor C provides base current for transistor $Q_2$ of the CA-3080 as shown in FIG. 4. Since the emitter current of transistor $Q_2$ is effectively programmed by the setting of $R_v$, the discharge rate of capacitor C may be shown to be a function of $R_v$ and the beta ($\beta$) of transistor $Q_2$. As long as the potential at terminal 3 of the CA-3080 exceeds the potential at terminal 2 (i.e. $E_1$ is greater than $E_2$) an output signal will be provided via terminal 6. By properly selecting the values of capacitor C, $R_v$, and $R_6$ the duration of this output signal may be controlled over a range of durations. Diode D operates to limit the maximum differential input voltage between the inverting and non-inverting terminals to 5 volts.

FIG. 5 is illustrative of a switching circuit for controlling the supply of power to a load in accordance with the present invention and will be seen to comprise a triac T having first and second main terminal electrodes and a gate electrode, a load $R_L$, and a timing circuit substantially identical to that of FIg. 1.

The timing circuit of FIG. 5 comprises an RCA CA-3094 integrated circuit operational amplifier (circumscribed in phantom) which differs from the CA-3080 in that it includes a Darlington output stage (i.e. transistors $Q_{12}$, $Q_{13}$ and resistors $R_a$, $R_b$) which amplifies the collector output of transistor $Q_{10}$ to provide a current output capable of triggering a high current thyristor. In addition, the timing circuit of FIG. 5 uses a set of selectable resistors $R_1$, $R_2$, $R_3$, $R_4$ in lieu of the variable resistance $R_v$ shown in FIG. 1.

The main terminal electrodes of triac T are connected in series with the load $R_L$ and a pair of input terminals $T_2$, $T_3$ adapted for connection to a source of alternating current. The output terminal 6 of the CA-3094 is connected to the gate electrode of the triac through a gate resistor $R_8$. For purposes of illustration and discussion terminal $T_2$ is taken as a point of reference potential.

Assuming the following component values

| | | | |
|---|---|---|---|
| C | .5/uf | $R_6$ | 50KΩ |
| $R_3$ | 22MΩ | $R_7$ | 5.1KΩ |
| $R_5$ | 10 Ω | $R_8$ | 1.5KΩ |

a DC supply voltage of 30 volts across terminals $T_1$ and $T_2$, and potentiometer $R_6$ set to its maximum value (i.e. 50KΩ), capacitor C will effectively charge to 30 volts when switch S is momentarily closed. At the instant switch S is released, capacitor C will begin to discharge into the base electrode of transistor $Q_2$ through the non-inverting input terminal 3 of the CA-3094 resulting in the delivery of a triggering signal to the gate electrode of the triac through $R_8$ via terminal 6, as discussed supra. For so long as the potential at terminal 3 exceeds the potential at terminal 2 (which may be set to 3 volts, for example, the amplified output of the Darlington stage appearing at terminal 6 of the CA-3094 will continuously trigger the triac into bidirectional conduction as a function of the polarity of the applied signal across terminals $T_2$, $T_3$. When the charge across capacitor C falls below the potential at terminal 2, transistor $Q_1$ begins to conduct more heavily than transistor $Q_2$, no output current is available at the collector of transistor $Q_{10}$, and the base-to-collector path of transistor $Q_{12}$ is reverse biased thereby precluding the Darlington stage from delivering an output at terminal 6.

By properly setting the amplifier bias current flowing into terminal 5 of the CA-3094 (i.e. by proper selection of $R_1$, $R_2$, $R_3$, $R_4$ or $R_v$, as the case may be), the emitter current requirements of the differential amplifier may be established and the discharge time of capacitor C varied. For example, selection of $R_3$ in FIG. 5 (i.e. 22 $\times 10^6$ ohms) with a DC power supply of 30 volts results in an emitter current of approximately 1.3 microamperes. Assuming a beta of 200 for transistor $Q_2$ its base current requirement would be approximately 6.5 $\times 10^{-9}$ amperes (i.e., $I_B = I_{E/\beta}$). The discharge duration $\tau$ for capacitor C to discharge from 30 volts to 3 volts can then be computed in accordance with the following equation $$\tau = (C\Delta V/i) = [(0.5 \times 10^{-6})\ (30-3)/6.5 \times 10^{-9}] \approx 35 \text{ min.}$$

The circuit of FIG. 5 has also been constructed and tested using the following components with the following results

| C | $R_2$ | $R_4$ | $\tau$ (approx.) | repeatability |
|---|---|---|---|---|
| 1$\mu$f | 4.7 MΩ | — | 5 min. | ±.2% |
| 1$\mu$f | — | 44 MΩ | 2 hrs. | ±1% |

Variations in the DC power supply of ±16 percent resulted in a time delay variation of ±1 percent. By interchanging the input terminals 2 and 3 the circuit can be adapted to provide an output signal at the conclusion of a timed duration.

Accordingly, an electronic timing circuit useful for timing the operation of electrical appliances or industrial machines has been disclosed which utilizes a single integrated circuit device and which can deliver substantial output currents without employing external power devices.

What is claimed is:

1. An electronic timing circuit for providing an output signal of programmable duration comprising:

an operational amplifier characterized by a pair of inputer terminals connected to the base electrodes of a pair of transistors connected in an emitter-coupled differential amplifier circuit;

means for applying a reference potential to one of said input terminals;

energy storage means connected in circuit with the other of said input terminals;

means for charging said energy storage means to a predetermined level of potential in excess of said reference potential;

means for discharging said energy storage means primarily through the base-emitter path of the respective transistor connected to said other input terminal;

means for selecting the value of the combined emitter currents of said pair of transistors thereby to provide means for adjusting the discharge rate of said storage means through said respective transistor connected to said other input terminal; and means for deriving an output signal from said operational amplifier whereby the output state of said operational amplifier is determined by the potential difference between said input terminals, the discharge duration of said energy storage means determining the duration of said output signal from said operational amplifier.

2. An electronic timing circuit as defined in claim 1 further comprising a current mirror connected in common with said differential pair, the bias input for establishing the current flow through said current mirror providing the means for varying the discharge rate of said energy storage means.

3. In combination;

a pair of transistors connected in differential configuration;

first and second input terminals connected in circuit with the base electrodes of said transistor pair;

a programmable direct current source connected in circuit with the commonly connected emitter electrodes of said differential pair;

bias means for adjustably programming the current flow through said direct current source;

means for deriving an output signal from said transistors when the potential at a given one of said input terminals exceeds the potential at the other of said input terminals, means for deriving a reference potential for application to one of said input terminals;

energy storage means connected in circuit with the other of said input terminals;

means for charging said energy storage means to a predetermined level of potential; and means for discharging said energy storage means primarily through said programmable direct current source via the transistor path connected in circuit with said other input terminal;

the discharge duration of said energy storage means varying substantially in direct proportion with the beta of said discharge transistor providing said discharge path and in inverse proportion to said current flow through said programmable direct current source, the duration of said output signal from said differential circuit means being determined by said discharge duration.

4. The invention as defined in claim 3 further comprising:

a semiconductor switching device having first and second main current carrying electrodes and a control electrode;

means for connecting said main current carrying electrodes in circuit with a load; and means for applying the output signal from said differential circuit means to said control electrode.

5. An electronic timing circuit for providing an output signal of programmable duration comprising:

first and second transistors commonly connected in differential configuration;

first and second input terminals connected in circuit with the base electrodes of said transistors;

first and second load circuits connected in circuit with said first and second transistors;

a first current mirror connected in circuit with the commonly connected electrodes of said differential pair, the current drawn by said current mirror being equal to the total load current flowing through said first and second transistors;

means for deriving an output signal equal to the difference in load current flowing through said first and second transistors when the potential at a given one of said input terminals exceeds the potential at the other of said input terminals;

means for adjustably programming the current flow through said first current mirror;

means for deriving a reference potential for application to one of said input terminals;

energy storage means connected in circuit with the other of said input terminals;

means for charging said energy storage means to a predetermined level of potential in excess of said reference potential; and means for discharging said energy storage means primarily through the transistor connected in circuit with said other input terminal.

6. The invention as defined in claim 5 wherein said first and second transistors have commonly connected emitter electrodes and said load circuits are connected in circuit with the collector electrodes thereof, said energy storage means discharging through the base-to-emitter path of said discharge transistor, the discharge duration of said energy storage means varying in direct proportion with the beta of said discharge transistor.

7. The invention as defined in claim 6 wherein means for deriving an output signal equal to the difference in load current flowing through said first and second transistors when the potential at a given one of said input terminals exceeds the potential at the other of said input terminals comprises:

a second and a third current mirror amplifiers having input circuits respectively furnishing said first and said second load circuits and having output circuits, and a fourth current mirror amplifier having an input and an output circuits connected to separate ones of said output circuits of said second and said third current mirror amplifiers, and providing at its said output circuit said output signal.

8. The invention as defined in claim 7 further comprising:

a semiconductor switching device having first and second main current carrying electrodes and a control electrode;

means for connecting said main current carrying electrodes in circuit with a load; and means for applying said output signal to said control electrode.

9. An adjustable timing circuit comprising, in combination:

a source of operating and reference potentials and of a potential intermediate therebetween;

an operational amplifier which includes first and second transistors each having a base and an emitter and a collector electrodes, means coupling said first transistor base electrode to said intermediate potential, a current source having a first terminal connected to each of the emitter electrodes of said first and said second transistors and having a second terminal connected to said reference potential, means coupling the collector electrodes of each of said first and said second transistors to said operating potential, and a load across which an output signal is to be developed included in the coupling of at least one of the collector electrodes of said first and said second transistors to said operating potential;

charge storage means connected between the base electrode of said second transistor and said reference potential;

means for charging said storage means to a voltage level higher than said intermediate potential; and means for adjusting the time required for said storage means to discharge primarily through the base-emitter path of said second transistor to a potential equal to said intermediate potential, which adjustment means comprises means for adjusting the level of current provided by said current source.

10. An adjustable timing circuit as set forth in claim 9 wherein said current source and the means for adjusting the level of the current it provides comprise:

a third transistor having a base and an emitter electrodes with a base-emitter junction therebetween, and having a collector electrode connected to the joined emitter electrodes of said first and said second transistors, its said emitter electrode being coupled to said reference potential;

a unilaterally conductive semiconductor device connected in parallel with said third transistor base-emitter junction;

a source of a biasing potential referred to said reference potential, and means providing an adjustable resistance between said third transistor base electrode and said source of biasing potential.

* * * * *